US006741446B2

(12) United States Patent
Ennis

(10) Patent No.: US 6,741,446 B2
(45) Date of Patent: May 25, 2004

(54) VACUUM PLASMA PROCESSOR AND METHOD OF OPERATING SAME

(75) Inventor: Gerard Ennis, Naas (IE)

(73) Assignee: Lam Research Corporation, Fremont, CA (US)

( * ) Notice: Subject to any disclaimer, the term of this patent is extended or adjusted under 35 U.S.C. 154(b) by 302 days.

(21) Appl. No.: 09/821,026

(22) Filed: Mar. 30, 2001

(65) Prior Publication Data

US 2002/0159216 A1 Oct. 31, 2002

(51) Int. Cl.[7] .............................................. H01T 23/00
(52) U.S. Cl. ..................................................... 361/234
(58) Field of Search ................................ 361/234, 233, 361/230; 315/111.31, 111.21

(56) References Cited

U.S. PATENT DOCUMENTS

| | | | |
|---|---|---|---|
| 4,948,458 A | | 8/1990 | Ogle |
| 4,956,043 A | | 9/1990 | Kanetomo et al. |
| 5,200,023 A | | 4/1993 | Gifford et al. |
| 5,400,209 A | * | 3/1995 | Moslehi ........................ 361/234 |
| 5,451,784 A | | 9/1995 | Loewenhardt et al. |
| 5,670,066 A | | 9/1997 | Barnes et al. |
| 5,740,016 A | | 4/1998 | Dhindsa |
| 5,759,280 A | | 6/1998 | Holland et al. |
| 5,766,696 A | * | 6/1998 | Itoh ............................ 427/577 |
| 5,801,386 A | | 9/1998 | Todorov et al. |
| 6,036,878 A | | 3/2000 | Collins |
| 6,042,686 A | * | 3/2000 | Dible et al. ............. 156/345.44 |
| 6,055,150 A | | 4/2000 | Clinton et al. |
| 6,124,725 A | * | 9/2000 | Sato ............................ 324/765 |
| 6,174,450 B1 | | 1/2001 | Patrick et al. |
| 6,188,563 B1 | | 2/2001 | Green |
| 6,232,236 B1 | * | 5/2001 | Shan et al. .................. 438/715 |
| 6,265,831 B1 | * | 7/2001 | Howald et al. .......... 315/111.21 |
| 6,362,946 B1 | * | 3/2002 | Larsen ........................ 361/234 |

FOREIGN PATENT DOCUMENTS

| | | |
|---|---|---|
| EP | 0552877 A1 | 7/1993 |
| EP | 0887835 A2 | 12/1998 |
| EP | 0939428 A2 | 9/1999 |
| WO | 9934398 A1 | 7/1999 |

OTHER PUBLICATIONS

Daviet, J.F., et al, "Electrostatic Clamping applied to Semiconductor Plasma Processing." 1046 *Journal of the Electrochemical Society* 140 (1993) Nov., No. 11, Hooksett, NH, US.

Patel, V. et al, "Wafer Temperature Measurements and End–Point Detection During Plasma Etching by Thermal Imaging," 320 *Applied Physics Letters*, 29 (1991)Sep. 9, No. 11, New York, US.

* cited by examiner

*Primary Examiner*—Brian Sircus
*Assistant Examiner*—Danny Nguyen
(74) *Attorney, Agent, or Firm*—Lowe Hauptman Gilman & Berner, LLP

(57) ABSTRACT

A vacuum plasma processor includes an electrode array with plural mutually-insulated electrodes forming a bottom or top electrode of the plasma processor. When the electrode array is part of the bottom electrode, the electrodes of the array are parts of a thermoelectric, Peltier effect arrangement responsive to localized temperature sensors and are parts of an electrostatic chuck. The thermoelectric arrangement controls localized temperature of workpieces and the chucking voltages indicate workpiece position relative to a workpiece holder including the electrodes. The electrodes of the arrays are coupled to circuitry for determining and/or controlling at least one localized plasma electric parameter at different locations of a workpiece and/or the plasma. The circuitry simultaneously supplies RF power having differing frequencies and/or power levels to different electrodes of the arrays and includes separate matching networks connected to the different electrodes of the array.

4 Claims, 6 Drawing Sheets

VACUUM PLASMA PROCESSOR AND METHOD OF OPERATING SAME

FIELD OF INVENTION

The present invention relates generally to vacuum plasma processors and more particularly to a vacuum plasma processor including an electrode array with plural mutually-insulated electrodes forming a bottom or top electrode of the plasma processor.

Another aspect of the invention relates to a vacuum plasma processor including a thermoelectric, Peltier effect arrangement for localized temperature control of workpieces.

An additional aspect of the invention relates to a vacuum plasma processor including a sensor arrangement and method for determining at least one localized processing parameter at different locations of a workpiece and/or plasma.

A further aspect of the invention relates to a vacuum plasma processor for controlling at least one localized electric parameter of a plasma processing workpiece.

Still another aspect of the invention relates to a vacuum plasma processor with control of at least one localized electric parameter of plasma coupled to different locations of a workpiece.

An added aspect of the invention relates to a plasma processor with sensing of workpiece position relative to a chucking electrode array with plural mutually insulated electrodes.

BACKGROUND ART

FIGS. 1 and 2 are schematic diagrams of two types of prior art vacuum plasma processors. The workpiece processor illustrated in FIG. 1 includes vacuum plasma processing chamber assembly 10, a first circuit 12 for driving a reactance for exciting ionizable gas in chamber assembly 10 to a plasma state, a second circuit 14 for applying RF bias to a workpiece holder in chamber assembly 10, and a controller arrangement 16 responsive to sensors for various parameters associated with chamber assembly 10 for deriving control signals for devices affecting the plasma in chamber assembly 10. Controller 16 includes microprocessor 20 which responds to various sensors associated with chamber assembly 10, as well as circuits 12 and 14, and signals from operator input 22, which can be in the form, for example, of a keyboard. Microprocessor 20 is coupled with memory system 24 including hard disk 26, random access memory (RAM) 28 and read only memory (ROM) 30. Microprocessor 20 responds to the various signals supplied to it to drive display 32, usually a typical computer monitor.

Hard disk 26 and ROM 30 store programs for controlling the operation of microprocessor 20 and preset data associated with different recipes for the processes performed in chamber assembly 10. The different recipes concern gas species and flow rates applied to chamber assembly 10 during different processes, the output power of AC sources included in circuits 12 and 14, the vacuum applied to the interior of chamber assembly 10, and initial values of variable reactances included in matching networks of circuits 12 and 14.

Plasma chamber assembly 10 includes chamber 40 having metal, non-magnetic cylindrical side wall 42 and metal, non-magnetic base 44, both of which are electrically grounded. Dielectric, typically quartz, window 46 is fixedly positioned on the top edge of wall 42. Wall 42, base 44 and window 46 are rigidly connected to each other by suitable gaskets to enable a vacuum to be established within the interior of chamber 40. Planar plasma excitation coil 48, for example, as configured in Ogle, U.S. Pat. No. 4,948,458 or Holland et al., U.S. Pat. No. 5,759,280, sits on or in very close proximity to the upper face of window 46. Coil 48, an electric reactance, reactively supplies magnetic and electric AC fields usually at an RF frequency, such as 13.56 MHz, to the interior of chamber 40, to excite ionizable gas in the chamber to a plasma, schematically illustrated in FIG. 1 by reference numeral 50. In other configurations, coil 48 is replaced with a powered or grounded electrode 55 that extends parallel to electrode 56, typically located in window 46 in close proximity to chamber 40 as illustrated in FIG. 2.

The upper face of base 44 carries holder, i.e. chuck, 52 for workpiece 54, which is typically a circular semiconductor wafer or a rectangular dielectric plate such as used in flat panel displays. Robotic arm 53 inside chamber 40 or coupled through a suitable air lab to the chamber interior responds to position control signals microprocessor 20 derives to correctly position workpiece 54 on chuck 52 so the center of the workpiece and chuck are vertically aligned. Microprocessor 20 derives the position control signals in response to position sensors (e.g., photodetectors) for sensing the relative positions of workpiece 54 and chuck 52. Chuck 52 typically includes metal plate 56 that forms an electrode (a reactive element). Electrode 56 carries dielectric layer 58 and sits on dielectric layer 60, which is carried by the upper face of base 44. Workpiece 54 is cooled by supplying helium from a suitable source 62 to the underside of dielectric layer 58 via conduit 64 and grooves (not shown) in electrode 56 and by supplying a liquid from a suitable source (not shown) to conduits (not shown) in chuck 52. With workpiece 54 in place on dielectric layer 58, DC source 66 supplies a suitable voltage through a switch (not shown) to electrode 56 to clamp, i.e., chuck, workpiece 54 to chuck 52. Chuck 52 can be monopolar or bipolar. When chuck 52 is bipolar, and designed for use with semiconductor wafers, electrode 56 includes two or more concentric, mutually-insulated circular metal elements having differing DC voltages applied to them.

With workpiece 54 secured in place on chuck 52, one or more ionizable gases from one or more sources 68 flow into the interior of chamber 40 through conduit 70 and port 72. For convenience, port 72 is shown as being in sidewall 42 but it is to be understood that gas usually is distributed by a manifold in the top of chamber 40. For convenience, only one gas source 68 is shown in FIG. 1, but it is to be understood that usually there are several gas sources of different species, e.g. etchants, such as $SF_6$, $CH_4$, $C_{12}$ and HBr, dilutants such as Ar or He, and $O_2$ as a passivation gas. The interior of conduit 70 includes valve 74 and flow rate gauge 76 for respectively controlling the flow rate of gas flowing through port 72 into chamber 40 and measuring the gas flow rate through port 72. Valve 74 responds to a signal microprocessor 20 derives, while gauge 76 supplies the microprocessor with an electric signal indicative of the gas flow rate in conduit 70. Memory system 24 stores for each recipe step of each workpiece 54 processed in chamber 40 a signal indicative of desired gas flow rate in conduit 70. Microprocessor 20 responds to the signal that memory system 24 stores for desired flow rate and the monitored flow rate signal gauge 76 derives to control valve 74 accordingly.

Vacuum pump 80, connected to port 82 in base 44 of chamber 40 by conduit 84, evacuates the interior of the chamber to a suitable pressure, typically in the range of one to one hundred millitorr. Pressure gauge 86, in the interior of chamber 40, supplies microprocessor 20 with a signal indicative of the vacuum pressure in chamber 40. Memory system 24 stores for each step of a particular workpiece processing recipe a signal indicative of desired vacuum pressure for the interior of chamber 40. Microprocessor 20 responds to the stored desired pressure signal memory system 24 derives for each recipe step and an electric signal from pressure gauge 86 to supply an electric signal to a drive for a gate valve (i.e. variable constriction) 87 in conduit 84 to maintain the pressure in chamber 40 at the set point or predetermined value for each recipe step.

Optical spectrometer 90 monitors the optical emission of plasma 50 by responding to optical energy emitted by the plasma and coupled to the spectrometer via window 92 in side wall 42. Spectrometer 90 responds to the optical energy emitted by plasma 50 to supply an electric signal to microprocessor 20. Microprocessor 20 responds to the signal that spectrometer 90 derives to detect an end point of the process (either etching or deposition) that plasma 50 is performing on workpiece 54. Microprocessor 20 responds to the signal spectrometer 90 derives and a signal memory system 24 stores indicative of a characteristic of the output of the spectrometer associated with an end point to supply the memory with an appropriate signal to indicate that the recipe step has been completed. Microprocessor 20 then responds to signals from memory system 24 to stop certain activities associated with the completed recipe step and initiate a new recipe step on the workpiece being processed in chamber 40 or commands release of workpiece 54 from chuck 52 and transfer of a new workpiece to the chuck, followed by instigation of another series of recipe processing steps.

Excitation circuit 12 for driving coil 48 includes constant frequency RF source 100, having a constant output power and typically having a frequency of 13.56 MHz. Source 100 drives power amplifier 102, having an electronically controlled power gain, so that the amplifier response time is on the order of a few microseconds or less, i.e., the output power of amplifier 102 changes from a first value to a second value in a few microseconds or less. The output power of amplifier 102 is in the range between 100 and 3000 watts. Amplifier 102 typically has a 50 ohm output impedance, all of which is resistive and none of which is reactive. Hence, the impedance seen looking back into the output terminals of amplifier 102 is typically represented by (50+j0) ohms, and cable 106 is chosen to have a characteristic impedance of 50 ohms.

For any particular recipe, memory system 24 stores a signal for desired output powers of amplifier 102. Memory system 24 supplies the desired output power of amplifier 102 to the amplifier by way of microprocessor 20. The output power of amplifier 102 can be controlled in an open loop manner in response to the signals stored in memory system 24 or control of the output power of amplifier 102 can be on a closed loop feedback basis. As the output power of amplifier 102 changes, the density of plasma 50 changes accordingly, as disclosed by Patrick et al., U.S. Pat. No. 6,174,450.

The output power of amplifier 102 drives coil 48 via cable 106 and matching network 108. Matching network 108, typically configured as a "T," includes two series legs including variable capacitor 112 and fixed capacitor 116, as well as a shunt leg including variable capacitor 114. Coil 48 includes input and output terminals 122 and 124, respectively connected to one electrode of capacitor 112 and to a first electrode of series capacitor 126, having a grounded second electrode. The value of capacitor 126 is preferably selected as described in the commonly assigned, previously mentioned, Holland et al. patent.

Electric motors 118 and 120, preferably of the step type, respond to signals from microprocessor 20 to control the values of capacitors 112 and 114 to maintain an impedance match between the impedance seen by looking from the output terminals of amplifier 102 into cable 106 and by looking from cable 106 into the output terminals of amplifier 102. Hence, for the previously described (50+j0) ohm output impedance of amplifier 102 and 50 ohm characteristic impedance of cable 106, microprocessor 20 controls motors 118 and 120 so the impedance seen looking from cable 106 into matching network 108 is as close as possible to (50+j0) ohms.

To control motors 118 and 120 to maintain a matched condition for the impedance seen looking into the output terminals of amplifier 132 and the impedance amplifier 132 drives, microprocessor 20 responds to signals from conventional sensor arrangement 104 indicative of the impedance seen looking from cable 106 into matching network 108. Alternatively, sensors can be provided for deriving signals indicative of the power that amplifier 102 supplies to its output terminals and the power reflected by matching network 108 back to cable 106. Typically, sensor arrangement 104 includes detectors for current and voltage magnitude and for the phase angle between the current and voltage. Microprocessor 20 responds, in one of several known manners, to the sensed signals that sensor arrangement 104 derives to control motors 118 and 120 to attain the matched condition.

Circuit 14 for supplying RF bias to workpiece 54 via electrode 56 has a construction somewhat similar to circuit 12. Circuit 14 includes constant frequency RF source 130, having a constant output power. The output of source 130 drives electronically controlled variable gain power amplifier 132, having substantially the same characteristics as amplifier 102. The output power of amplifier 32 controls the energy of plasma in proximity to workpiece 54, as disclosed by Patrick et al., U.S. Pat. No. 6,174,450. Amplifier 132 drives a cascaded arrangement including directional coupler 134, cable 136 and matching network 138. Matching network 138 includes a series leg comprising the series combination of fixed inductor 140 and variable capacitor 142, as well as a shunt leg including fixed inductor 144 and variable capacitor 146. Motors 148 and 150, which are preferably step motors, respectively vary the values of capacitors 142 and 146 in response to signals from microprocessor 20.

Output terminal 152 of matching network 138 supplies an RF bias voltage to electrode 56 by way of series coupling capacitor 154 which isolates matching network 138 from the chucking voltage of DC source 66. The RF energy that circuit 14 applies to electrode 56 is capacitively coupled via dielectric layer 48, workpiece 54 and a plasma sheath between the workpiece and plasma to the portion of plasma 50 in close proximity with chuck 52. The RF energy that chuck 52 couples to plasma 50 establishes a DC bias in the plasma; the DC bias typically has values between 50 and 1000 volts. The DC bias resulting from the RF energy circuit 14 applies to electrode 52 accelerates ions in plasma 50 to workpiece 54. If electrode 56 has a bipolar configuration, the plural mutually-insulated metal elements are driven in parallel by output terminal 152 of matching network 138 and appropriate blocking capacitors are provided so there is DC isolation between the metal elements.

Alternatively, RF source 130 is a source arrangement having two or more sources, operating at different frequencies, such as 4.0 MHz, 13.56 MHz and 27.1 MHz. Source 130 simultaneously supplies these different frequencies through different power amplifiers, directional couplers, cables, sensors and matching networks to electrode 56. The lower frequencies cause ion energy in the plasma in proximity to workpiece 54 to increase, while the higher frequencies cause an increase in ion density of the plasma in proximity to workpiece 54.

Microprocessor 20 responds to signals indicative of the impedance seen looking from cable 136 into matching network 138, as derived by known sensor arrangement 139, to control motors 148 and 150 and the values of capacitors 142 and 146 in a manner similar to that described supra with regard to control of capacitors 112 and 116 of matching network 108.

For each process recipe step, memory system 24 stores set point signals for the net power coupled by directional coupler 134 to cable 136. The net power coupled by directional coupler 134 to cable 136 equals the output power of amplifier 132 minus the power reflected from the load and matching network 138 back through cable 136 to the terminals of directional coupler 134 connected to cable 136. Memory system 24 supplies the net power set point signal associated with circuit 14 to microprocessor 20. Microprocessor 20 also responds to output signals directional coupler 134 supplies to power sensor arrangement 141. Sensor arrangement 141 derives signals indicative of output power of amplifier 132 and power reflected by cable 136 back toward the output terminals of amplifier 132.

Microprocessor 20 responds to the set points and measured signals sensor arrangement 141 derives, which measured signals are indicative of the output power of amplifier 132 and the power reflected back to amplifier 132, to control the power gain of amplifier 132 and the plasma energy. The output power of amplifier 132 is also dynamically changed as a function of time as changes in a recipe are ordered by memory system 24. The dynamic changes in the output power are stored in memory system 24 and control the power gain of amplifier 132.

One of the elements of memory system 24, typically read-only memory 30, stores preprogrammed values for controlling the output power of amplifier 102 and/or 132 during a step of the recipe of plasma 50 processing workpiece 54. The preprogrammed values thereby control the amount of power that coil 48 and/or electrode 56 supply to the plasma 50 in chamber 40 to enable the power that coil 48 and/or electrode 56 supplies to the plasma to change as a function of time in accordance with a preprogrammed predetermined function.

A problem with the prior art processors is that ions in the plasma in proximity to workpiece 54 have differing energies and densities at different localized portions of the workpiece. In addition, there are frequently temperature variations at different localized portions of the workpiece. Consequently, when the prior art processors are used for etching purposes, different portions of workpiece 54 are etched differentially and when the processors are used for deposition purposes different amounts of materials are deposited on different portions of the workpiece. While considerable improvement has been made in reducing the differential variations of the processing at different localized portions of the workpiece, problems still remain.

I am aware that Dhindsa, U.S. Pat. No. 5,740,016, discloses an arrangement wherein a workpiece in a plasma processing chamber deals with the problem of different localized portions of the workpiece having different temperatures. The '016 patent deals with the problem by providing a plurality of thermoelectric modules of the Peltier effect type in heat transfer contact with a workpiece holder in the vacuum processing chamber. A current supply interface, connected to the plurality of thermoelectric modules, applies controlled currents to the modules to control the temperature of the workpiece holder and to provide a desired temperature distribution across the workpiece during workpiece processing. The '016 patent assumes that different portions of the workpiece always have the same relative temperature distribution. A controller stores signals indicative of the relative temperature distribution of the different workpiece portions. A single sensor for the entire workpiece temperature controls the level of the signals the controller supplies to the thermoelectric modules. Hence, if the assumption that different portions of the workpiece always have the same relative temperature distribution is not accurate for a particular situation, the approach the '016 patent discloses may not provide optimum temperature control of the workpiece.

It is, accordingly, an object of the present intention to provide a new and improved plasma processor and method of operating same.

Another object of the invention is to provide a new and improved plasma processor apparatus for and method of providing greater uniformity of ion energy and/or ion density of a plasma coupled to a workpiece being processed.

An additional object of the invention is to provide a new and improved electrode arrangement for a plasma processor which enables workpieces to be processed in such a manner that there is greater uniformity of ion energy and/or ion density of plasma coupled to a workpiece being processed.

A further object of the invention is to provide a new and improved plasma processor apparatus for and method of monitoring and controlling localized temperature dependence of a workpiece being processed.

Still an additional object of the invention is to provide a new and improved plasma processor apparatus for and method of providing greater uniformity of ion energy and/or ion density of a plasma coupled to a workpiece being processed, while providing greater temperature uniformity of the processed workpiece.

Yet a further object of the invention is to provide a new and improved electrode arrangement for a plasma processor which enables workpieces to be processed in such a manner that there is greater temperature uniformity of the processed workpiece.

Still an added object of the invention is to provide a new and improved electrode arrangement for a plasma processor, which electrode arrangement enables greater uniformity of ion energy and/or ion density of a plasma coupled to a workpiece being processed, while providing greater temperature uniformity of the processed workpiece.

An added object of the invention is to provide a new and improved plasma processor apparatus for and method of positioning a workpiece on a workpiece holder without using dedicated position transducers.

SUMMARY OF THE INVENTION

According to one aspect of the invention, a sensor arrangement detects electric properties of different localized portions of an AC plasma of a vacuum plasma processor, wherein the processor includes a reactance for exciting gas in a vacuum chamber to the AC plasma. The sensor arrangement derives signals indicative of the detected electric properties.

According to another aspect of the invention, different localized electric properties of an AC plasma of a vacuum plasma processor are controlled. The controlled electric properties are typically plasma density, plasma energy, and/or plasma impedance coupled to an electrode array. In one preferred embodiment, control of the different localized electric properties of the AC plasma is in response to signals the sensor arrangement derives indicative of the detected electric properties. In another embodiment of the invention, such control is in response to signals a memory stores, wherein the signals the memory stores were collected prior to processing of the workpiece being currently processed by the controlled plasma.

According to a further aspect of the invention, temperature properties of different localized portions of a workpiece on a workpiece holder in the chamber are controlled by sensing temperatures of different localized portions of the workpiece. The control of the temperature properties of different localized portions of the workpiece is preferably provided by separate thermoelectric devices of the Peltier effect type in response to sensed temperature at different localized regions of the workpiece.

In the preferred embodiment, arrays of mutually electrically insulated electrodes are instrumental in providing control of the plasma electric properties and/or the workpiece temperature. An array of such electrodes can be provided in the workpiece holder or as a reactance at the top of the chamber for coupling AC plasma excitation energy to gas in the chamber. When the electrodes are included in the workpiece holder, the electrodes supply AC power to the plasma and can be arranged to provide electrostatic chucking of the workpiece and/or form part of each of the thermoelectric devices, and/or part of sensors for the workpiece position relative to the workpiece holder. An AC source arrangement preferably drives each of the electrodes so that different electrodes of the arrays are supplied with AC power having differing frequencies and/or magnitudes. An impedance matching network is preferably connected between each of the electrodes and an AC source of the AC source arrangement. Reactances of the matching network are controlled in response to indications of the degree of impedance match between the AC source and the load the particular impedance matching network drives, that is, the electrode connected to the impedance matching network and the plasma load driven by that electrode. The frequency and/or magnitude of the AC power driving a particular electrode are controlled by the power in the plasma and/or the impedance loading that electrode.

The above and still further objects, features and advantages of the present invention will become apparent upon consideration of the following detailed description of specific embodiments thereof, especially when taken in conjunction with the accompanying drawings.

DETAILED DESCRIPTION OF THE PREFERRED EMBODIMENTS

Figure 3:
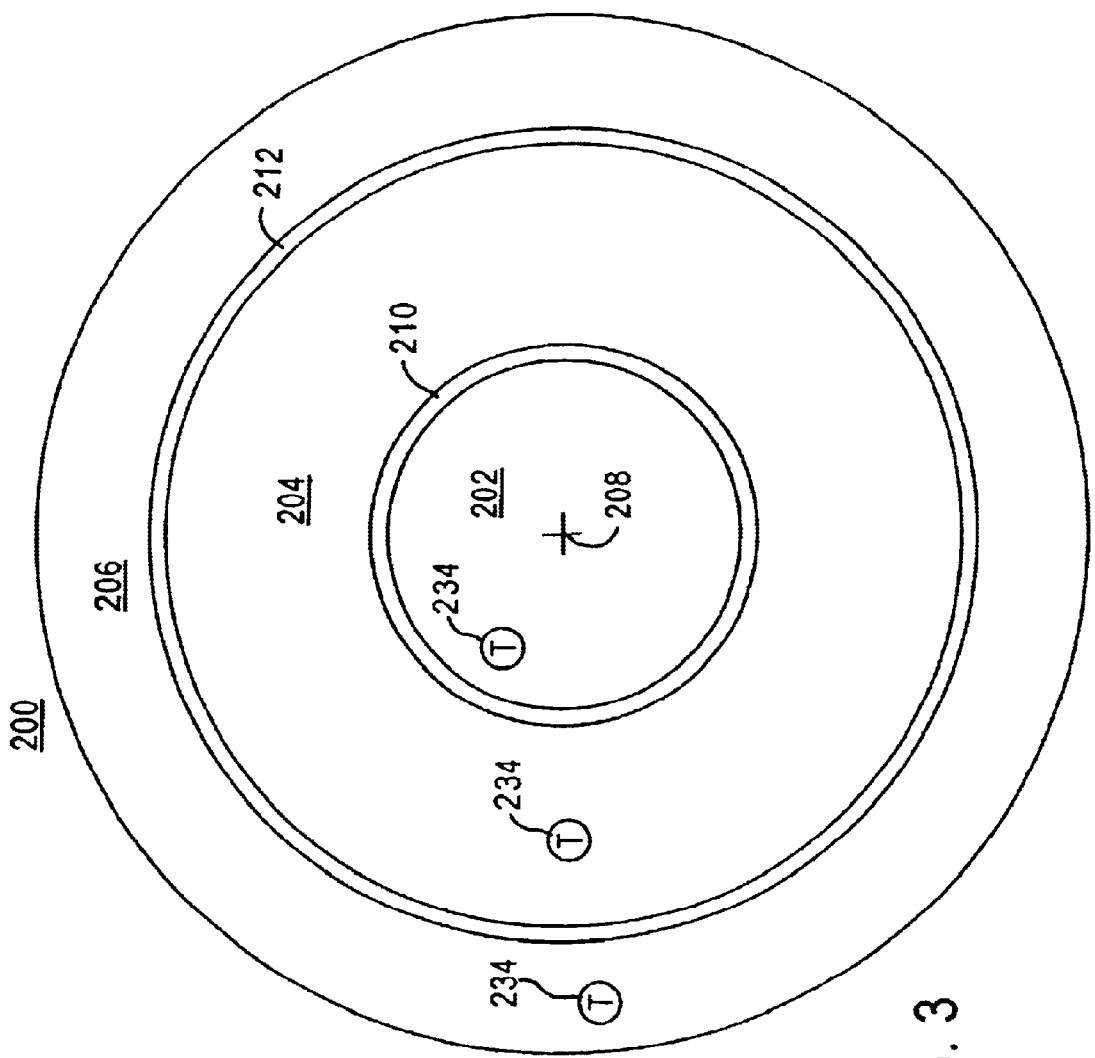
FIG. 3 is a front view of one embodiment of an electrode array in accordance with a preferred embodiment of the invention, wherein the array includes three mutually insulated, concentric circular electrodes which can replace electrode 56 of FIG. 1 or electrode 55 of FIG. 2.

Reference is now made to FIG. 3 of the drawing wherein electrode array 200 is illustrated as including mutually insulated electrodes 202, 204 and 206. Each of electrodes 202, 204 and 206 is concentric with center 208 of electrode array 200 and has a circular periphery so that electrode 202 is shaped as a circle and each of electrodes 204 and 206 is shaped as a ring. Electric insulator 210, shaped as a ring, connects the periphery of electrode 202 to the inner circumference of electrode 204, while ring shaped electric insulator 212 connects the periphery of electrode 204 to the interior circumference of electrode 206. Typically radii of electrodes 202 and 204 are respectively one third and two thirds of the radius of the exterior of electrode 206.

The circular configuration of electrode array 200 is used with chambers 40 for processing circular workpieces, such as semiconductor wafers. If chamber 40 is used for processing workpieces having a rectangular configuration, such as glass substrates for flat-panel displays, in which case the chamber has a rectangular, rather than circular, configuration, the circular shape of array 200 is replaced with an array having a rectangular shape.

Figure 1:
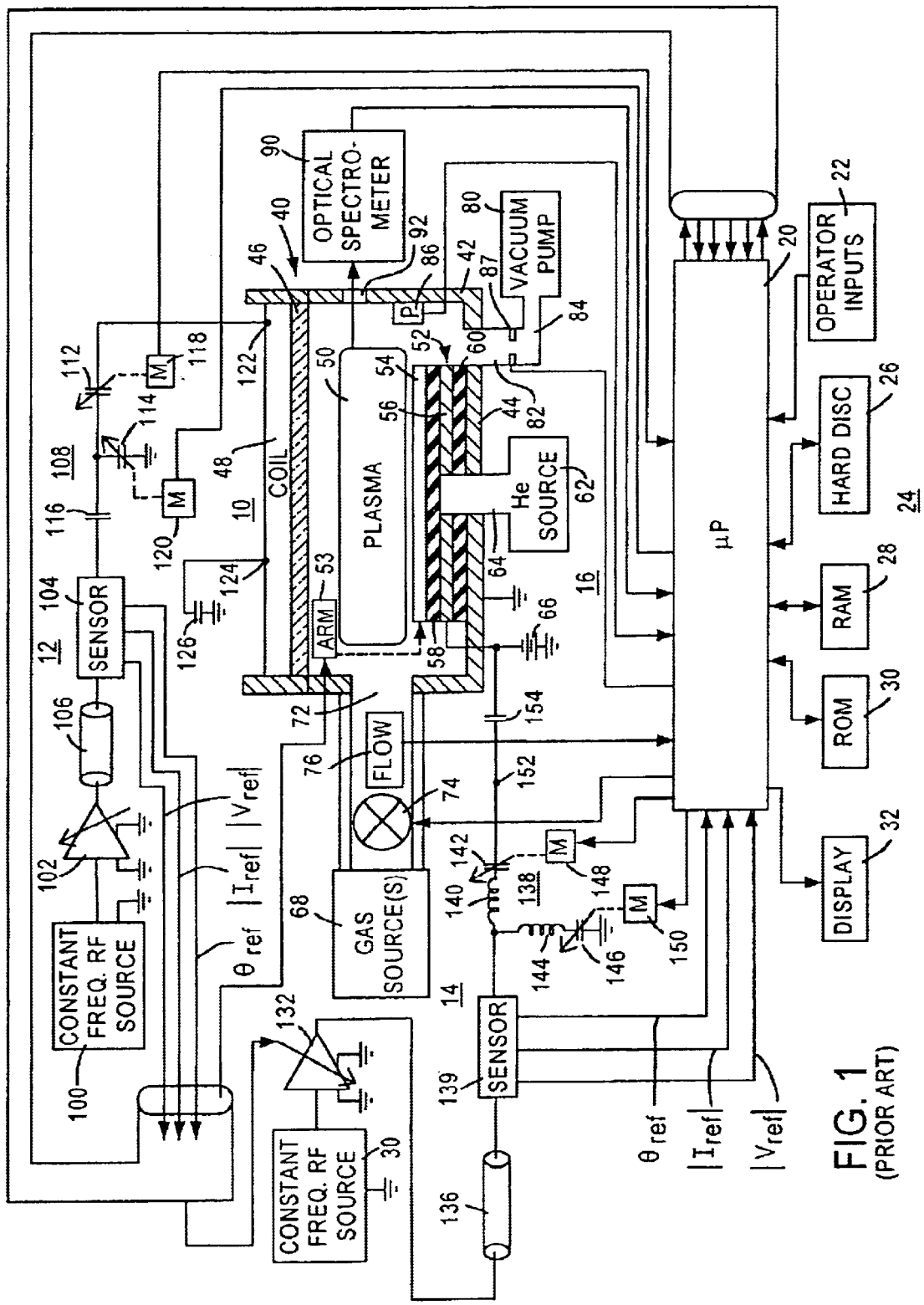
FIGS. 1 and 2, as previously described, are schematic diagrams of prior art plasma processors respectively including a plasma excitation coil and a top plasma excitation electrode.
Figure 2:
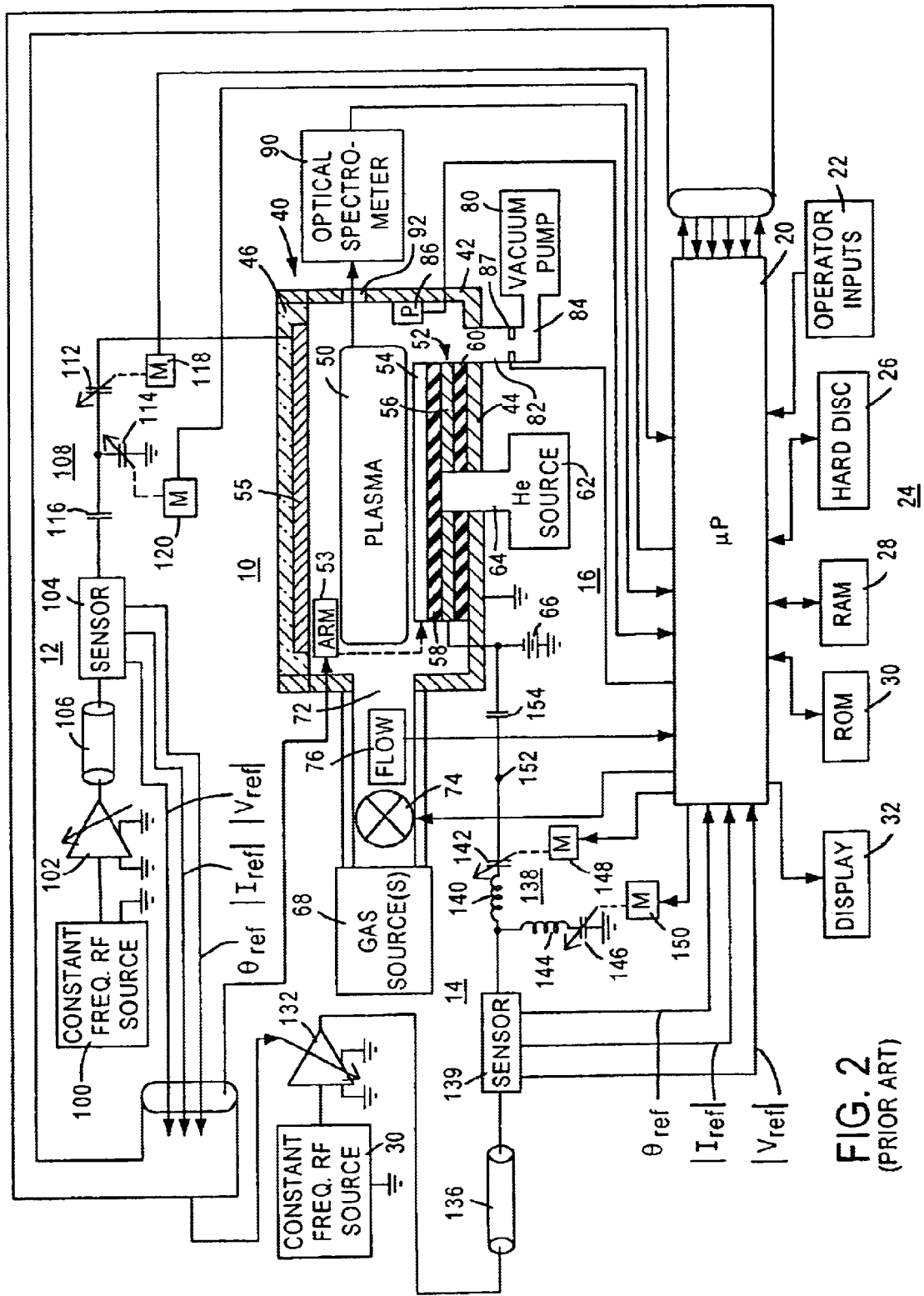

Electrode array 200 can be used as top electrode 55, FIG. 2, and/or as bottom electrode 56, FIGS. 1 and 2. When electrode array 200 is used as top electrode 55, (1) the dimensions of the exterior perimeter of electrode 206 are slightly less than the interior dimensions of chamber 40, (2) electrodes 202, 204 and 206 are driven by AC power that can have differing magnitudes and/or frequency, and (3) the electrodes are formed of metal, such as copper or aluminum, or a semiconductor material, as disclosed by Collins et al., U.S. Pat. No. 6,077,384, or the commonly assigned, co-pending application of Ni et al., Ser. No. 09/689,616, filed Oct. 13, 2000, for Etch Chambers With Hybrid Plasma Source.

When electrode array 200 is used as bottom electrode 56, the dimensions of the exterior perimeter 206 are the same as the exterior dimensions of workpiece 54 and each of electrodes 202, 204 and 206 is formed of metal, preferably copper. When workpiece 54 is correctly positioned on chuck 56, the centers of array 200 and the workpiece are aligned. Electrodes 202, 204 and 206 of bottom electrode 56 form a bipolar electrostatic chuck and thus are driven by DC voltages having sufficient magnitude to clamp workpiece 54 to workpiece holder 52. Electrodes 202, 204 and 206 of bottom electrode 56 are also driven by AC power that can have differing magnitudes and/or frequency to establish a DC bias voltage on the bottom electrode. In addition, electrodes 202, 204 and 206 of bottom electrode 56 can be part of thermoelectric devices of the Peltier effect type. In such a case, each of the electrodes 202, 204 and 206 includes at least one radially extending slit (not shown) so that opposite parallel, elongated edges of each slit are electrically insulated from each other for DC purposes. The portion of each of electrodes 202, 204 and 206 at the edge of each slit carries a semiconductor, such as bismuth telluride, that exhibits thermoelectric properties when connected to the metal forming the electrodes.

Figure 4:
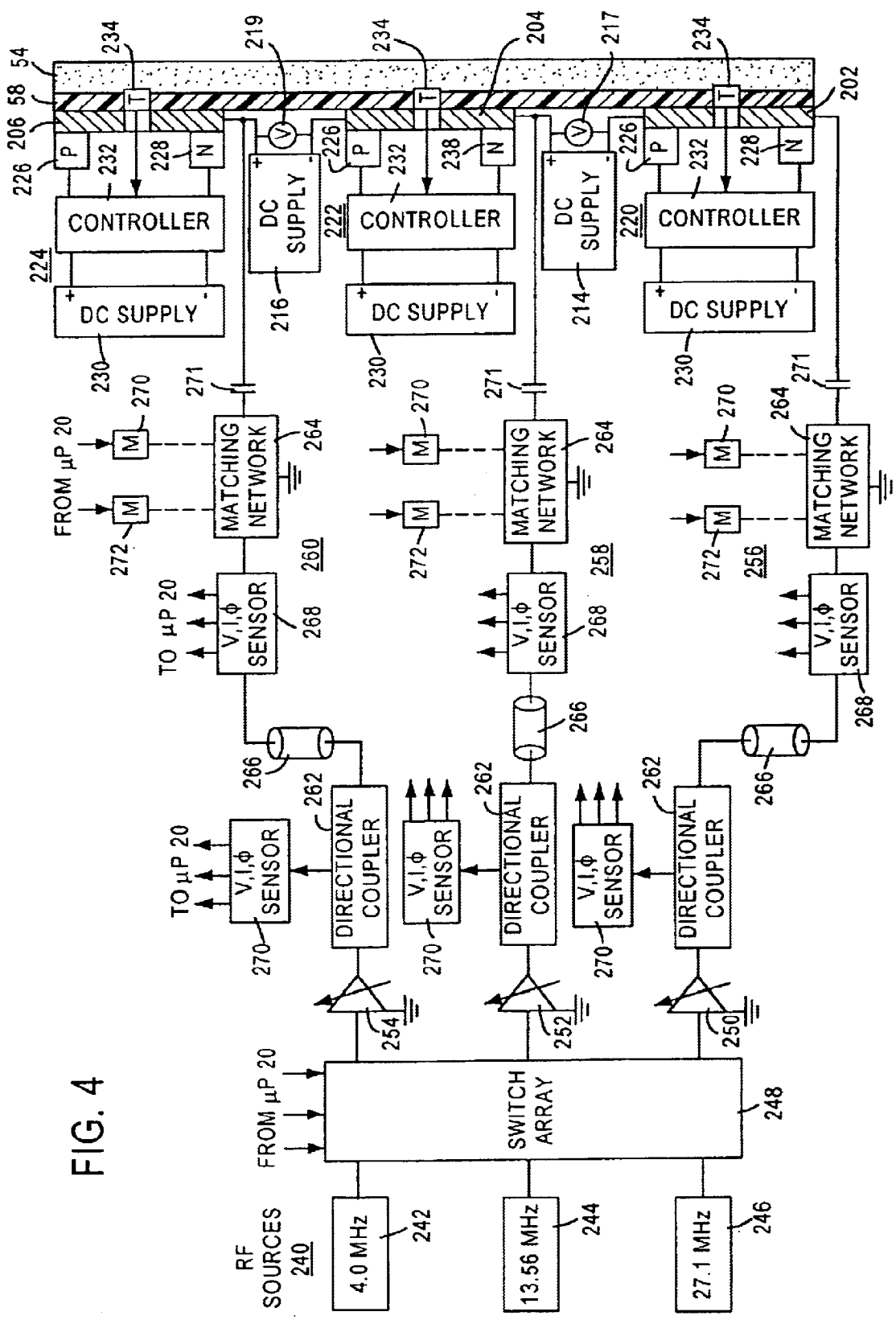
FIG. 4 is a partially schematic electric diagram of an arrangement for driving the array of FIG. 3 and schematically includes representations of thermoelectric devices for controlling the localized temperature of a workpiece.

Reference is now made to FIG. 4 of the drawing, a schematic diagram of circuitry for driving electrodes 202, 204 and 206 when array 200 is included in chuck 52. To facilitate the presentation, electrodes 202, 204 and 206 are illustrated in FIG. 4 as rectangular plates, but is to be understood that the electrodes are configured as discussed above in connection with FIG. 3. To provide consistency with FIG. 1, electrodes 202, 204 and 206 are immediately below electric insulating plate 58, which has a sufficiently high thermal conductivity so there is a substantially constant temperature across the plate, which is preferably made of mica to achieve this result. Electrodes 202, 204 and 206 electrostatically clamp workpiece 54 in place on the upper surface of insulating plate 58 by virtue of DC power supplies 214 and 216 being connected so that the negative and positive electrodes of power supply 214 are respectively connected to electrodes 202 and 204, while the negative and positive electrodes of power supply 216 are respectively connected to electrodes 204 and 206. DC voltmeters 217 and 219 are connected between electrodes 202, 204 and 206, such that voltmeter 217 is connected between electrodes 202 and 204 while voltmeter 219 is connected between electrodes 206 and 208. Voltmeters 217 and 219 effectively monitor the electrostatic clamping forces electrodes 202, 204 and 206 apply to the regions of workpiece 54 respectively above the electrodes. Because of the symmetrical nature of chamber 40, chuck 52 and workpiece 54, differences in the voltages that meters 217 and 219 detect indicate the relative position of workpiece 54 relative to electrodes 202, 204 and 206. Meters 217 and 219 supply to microprocessor 20 signals indicative of the voltages the meters detect. Microprocessor 20 responds to these voltages to derive signals indicative of the workpiece position relative to workpiece holder (i.e., chuck) 52.

Figure 5:
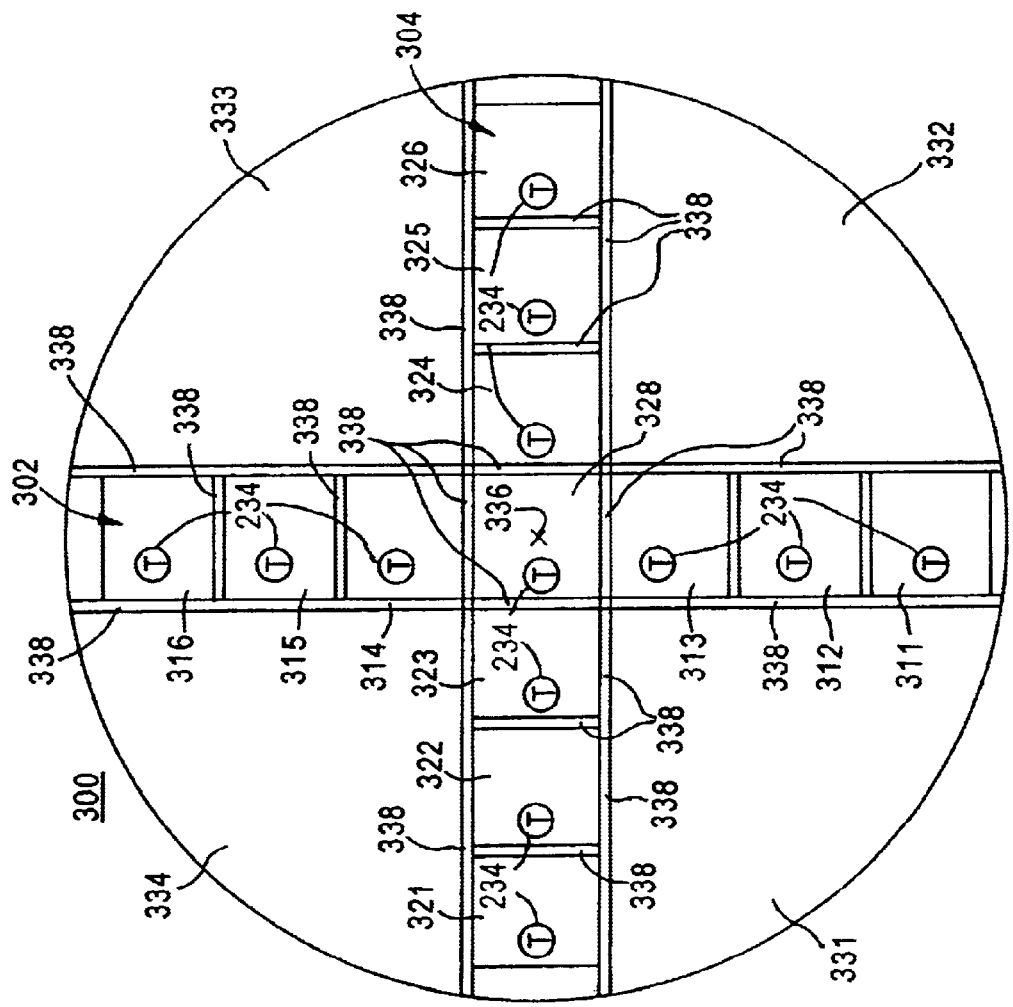
FIG. 5 is a front view of a second embodiment of an electrode array in accordance with a preferred embodiment of the invention, wherein the array includes electrodes having a rectangular shape arranged as a pair of stripes extending at right angles to each other, wherein the stripes intersect at a point aligned with the center of a workpiece holder.
Figure 6:
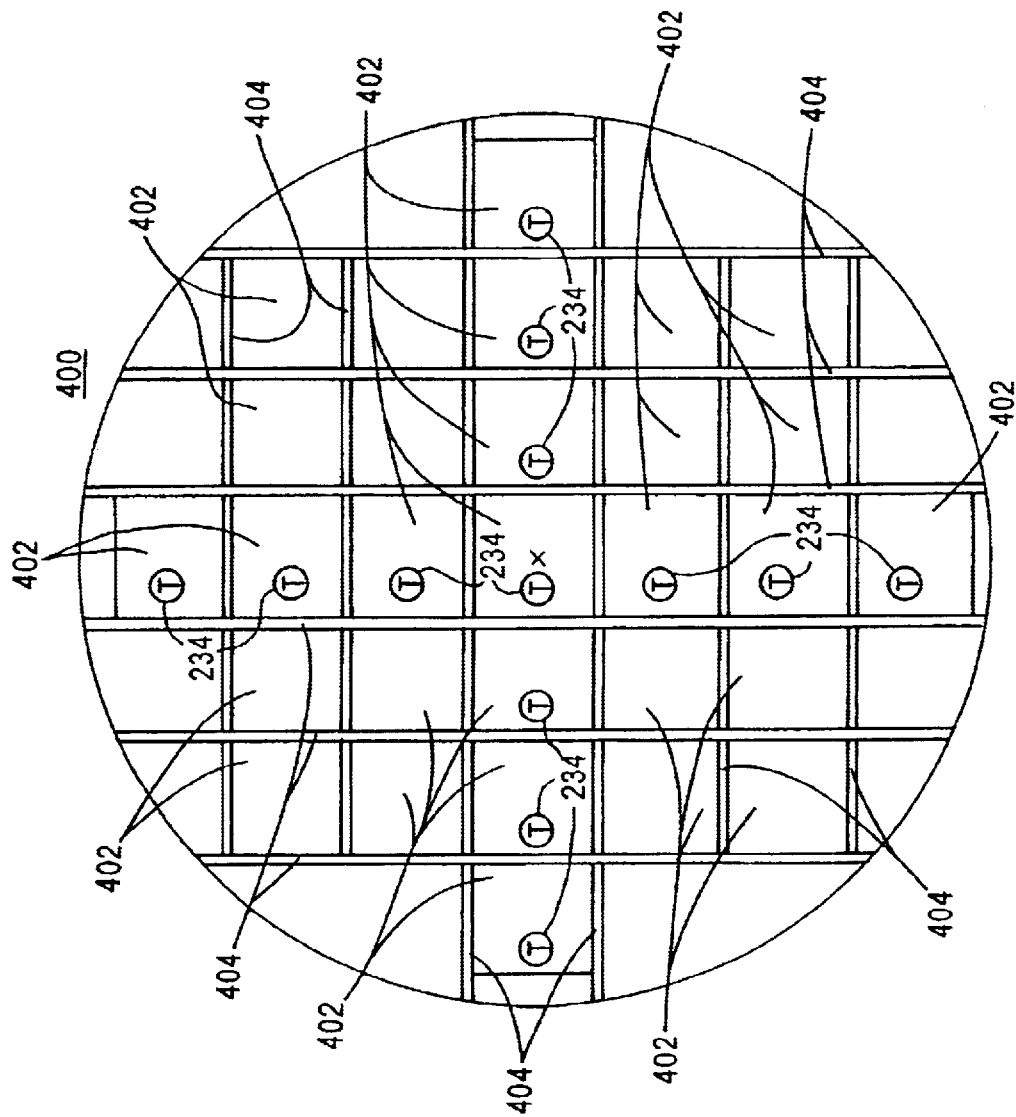
FIG. 6 is a front view of a third embodiment of an electrode array in accordance with a preferred embodiment of the invention, wherein the electrodes have a rectangular shape and are arranged as a matrix of rows and columns.

Microprocessor 20 responds to the position indicating signals to drive robotic arm 53 to position the center of workpiece 54 in vertical alignment with the center of chuck 52. Because the positioning operation resolution is a function of the number of electrodes in the array of chuck 52, the arrays such as shown in FIGS. 5 and 6, which include many more electrodes than the three electrode array of FIG. 3, enable the workpiece to be positioned with great accuracy without requiring special position sensors. In some situations, there may not be a need to position a workpiece 57 with great accuracy because the DC voltmeters enable microprocessor 20 to determine workpiece position. Control of the localized plasma parameters on the workpiece can be provided by proper energization of electrodes in the array of workpiece holder 52 or the array at the top of chamber 40 in response to the high resolution position microprocessor 20 detects from the output of the FIG. 6 array. The signals the DC voltmeters derive facilitate electronic machine maintenance and set up because the system can teach itself where workpiece 54 is and therefore do away with the need to have a service engineer spend valuable downtime performing calibration tests. This is advantageous in a high volume processor facility having a low mean time to repair requirement.

Temperature controllers 220, 222 and 224 of the thermoelectric, that is, Peltier effect, type respectively provide localized temperature control of workpiece 54 in the workpiece regions above electrodes 202, 204 and 206. Each of temperature controllers 220, 222 and 224 includes a P-type semiconductor structure 226 and an N-type semiconductor structure 228, mounted on electrodes 202, 204 and 206 at or adjacent each slit edge, as described above. Semiconductor structures 226 and 228 are made of any suitable materials, such as bismuth telluride, indium antimonide or indium gallium arsenide. Semiconductor structures 226 and 228 and electrodes 202, 204 and 206 of temperature controllers 220, 222 and 224 are thermally connected to the localized portions of workpiece 54 immediately above electrodes 202, 204 and 206, respectively; that is, there is a heat transfer relation between the temperature controllers and the localized portions of the workpiece immediately above the electrodes of each of the temperature controllers.

Each of temperature controllers 220, 222 and 224 includes a DC power supply 230 and a DC voltage controller 232 which responds to a temperature indicating voltage that temperature sensor 234 derives. Temperature sensor 234 responds to the localized temperature of the portion of workpiece 54 directly above the electrode 202, 204 or 206 with which the temperature controller including the particular temperature sensor is associated. Temperature sensor 234 can be a heat responsive element embedded in insulator plate 58 or can include a fiber optic element having one end embedded in plate 58, in combination with a thermal radiation responsive element coupled to the other end of the fiber optic element.

Voltage controller 232, which can be a stand-alone unit or be included in microprocessor 20, responds to the signal that temperature sensor 234 derives to control the magnitude and polarity of the DC voltage applied across semiconductor structures 226 and 228. If it is desired to control the localized temperature of workpiece 54 to a set point value associated with each of temperature controllers 220, 222 and 224, voltage controller 232 responds to the set point value and the temperature that sensor 234 indicates to change the amplitude and polarity of the voltage applied across semiconductor structures 226 and 228. For example, if the temperature indicated by a particular sensor 234 exceeds the set point, voltage controller 232 causes positive current to flow into P-type structure 226 to cool the portion of workpiece 54 in proximity to that particular sensor. In contrast, if the temperature indicated by a particular sensor 234 is less than the set point, voltage controller 232 causes positive current to flow into N-type structure 228 to heat the portion of workpiece 54 in proximity to that particular sensor.

If the control function is included in microprocessor 20, the signals that temperature sensors 234 derive are supplied to the microprocessor. In such a case, microprocessor 20 controls the voltages DC power supplies 230 supply to semiconductor structures 226 and 228. The microprocessor responds to the signals from the temperature sensors 234 of thermoelectric controllers 220, 222 and 224 and can combine them to obtain an average value of the temperature of workpiece 54 at the three localized portions of the workpiece which are monitored by the temperature sensors. The microprocessor responds to the average temperature value and the temperature values indicated by the sensors associated with each of thermoelectric controllers 220, 222 and 224 to control the magnitude and polarity of the DC voltage that voltage controllers 232 supply to the semiconductor structures 226 and 228 of the individual thermoelectric devices.

The remaining circuitry illustrated in FIG. 4 is concerned with maintaining the plasma processing of workpiece 54 substantially uniform over the entire area of the workpiece. To this end, the remaining circuitry illustrated in FIG. 4, in combination with the processing by microprocessor 20 and signals stored in memory system 24, effectively controls the electric properties of plasma 50 in proximity to the localized portions of workpiece 54 respectively above electrodes 202, 204 and 206 when array 200 is part of chuck 52. The remaining circuitry illustrated in FIG. 4 can also be used to drive electrode array 200 when array 200 replaces top electrode 55, FIG. 2. In such a situation, the remaining circuitry illustrated in FIG. 4 provides localized control for different portions of plasma 50 in proximity to the localized portions of top electrode 55, respectively below electrodes 202, 204 and 206.

The remaining circuitry illustrated in FIG. 4 includes an AC source arrangement 240 including two or more RF sources, in particular 4.0 MHz source 242, 13.56 MHz source 244 and 27.1 MHz source 246. Outputs of sources 242, 244 and 246 drive switch array 248 having control input signals which microprocessor 20 derives. The control signals from microprocessor 20 activate switch array 248 so that the outputs of sources 242, 244 and 246 are selectively applied to networks which ultimately drive electrodes 202, 204 and 206. Microprocessor 20 responds to signals indicative of the plasma impedance and plasma power separately loading each of electrodes 202, 204 and 206 to determine the density and energy in the ions of the plasma load separately coupled to each of the electrodes. Alternatively, ROM 30 and/or hard disk 26 of memory system 24 store (1) signals representing the impedance separately loading each of electrodes 202, 204 and 206 for the particular recipe step being performed by plasma 50 on workpiece 54 or (2) signals representing desired energy of different localized regions of the plasma. In both cases, microprocessor 20 responds to the stored signals to control the desired density and energy in the ions of the plasma load separately coupled to each of electrodes 202, 204 and 206.

Microprocessor 20 responds to the determined or desired energy and/or energy in the ions of the plasma separately coupled to each of electrodes 202, 204 and 206 to derive signals for controlling switch array 248. If it is desired for the plasma coupled with a particular one of the electrodes of array 200 to have a high-energy, microprocessor 20 activates switch array 248 to supply the output of 4.0 MHz source 242 to such an electrode. If it is desired for the plasma coupled with another one of the electrodes of array 200 to have low energy, microprocessor 20 activates switch array 248 to supply the output of 13.56 MHz source 244 or 27.1 MHz source 246 to such an electrode. Hence, microprocessor 20 can activate switch array 248 so that different frequencies from source arrangement 240 are simultaneously supplied to different electrodes of array 200. Hence, e.g. RF power having frequencies of 4.0 MHz and 13.56 MHz respectively drive electrodes 202 and 204 at the same time. This enables localized control of the plasma energy coupled to different localized portions of workpiece 54.

If plasma in different portions of chamber 40 has a tendency to have different energies and it is desired for the plasma coupled to different portions of workpiece 54 to have substantially the same energy, microprocessor 20 controls switch array 248 to achieve such a result. If, on the other hand, it is desired for the plasma coupled to different portions of workpiece 54 to have substantially different energies, microprocessor 20 controls switch array 248 to achieve that result.

Microprocessor 20 can also control switch array 248 to control the density of the plasma simultaneously coupled to different localized portions of workpiece 54. If it is desired for the density of plasma coupled to a first portion of workpiece 54 above a first of the electrodes of array 200 to be greater than the density of the plasma coupled to a second portion of workpiece 54 above a second of the electrodes of array 200, microprocessor 20 activates switch array 248 so that the relatively high frequency from 13.56 MHz source 224 or 27.1 MHz source 246 drives the first electrode and the low frequency from 4.0 MHz source 242 drives the second electrode.

Plasma energy in different localized portions of the plasma can also be controlled by varying the RF power applied to each of the electrodes of array 200. To this end, the three output leads of switch array 248 which supply RF to electrodes 202, 204 and 206 drive variable power gain amplifiers 250, 252 and 254, respectively. Microprocessor 20 controls the gains of power amplifiers 250, 252 and 254 in response to signals ROM 30 or hard disk 26 of memory system 24 supplies to the microprocessor or in response to signals supplied to the microprocessor indicative of the power in the plasma respectively loading electrodes 202, 204 and 206. Microprocessor 20 integrates over time the power representing signals associated with each of electrodes 202, 204 and 206 to provide measures of the energies in the plasma separately loading each of the separate electrodes.

Amplifiers 250, 252 and 254 derive RF output power that is respectively applied to electrodes 202, 204 and 206 by way of circuits 256, 258 and 260. Because each of circuits 256, 258 and 260 is the same, a description of only circuit 256 suffices.

Circuit 256 includes directional coupler 262 having one output which drives matching network 264 by way of cable 266 and sensor arrangement 268. Sensor arrangement 268 responds to the current and voltage reflected by matching network 264 back toward amplifier 250 to derive the signals indicative of the magnitude of the reflected voltage and current as well as the phase angle between the reflected voltage and current. Directional coupler 262 has a second output which drives sensor arrangement 270. Sensor arrangement 270 responds to the current and voltage at the output terminals of amplifier 250 to derive signals indicative of the magnitude of the voltage and current at the output terminals of the amplifier, as well as the phase angle between the voltage and current at the amplifier output terminals.

Sensor arrangements 268 and 270 supply the signals they derive to microprocessor 20, which responds to the output signals of the sensors and the signals memory system 24 stores to derive signals indicative of electric parameters of the plasma loading electrode 202, the reflected power of the plasma coupled to electrode 202 and control signals for the values of variable reactances in matching network 264. The electric parameters of the plasma loading electrode 202 typically are the magnitudes of electrode voltage, electrode current and the phase angle between the electrode voltage and current. Microprocessor 20 also responds to the output signals of sensor arrangements 268 and 270 and signals stored in memory system 24 to derive signals indicative of the degree of impedance match between the output impedance of amplifier 250 and the load coupled to electrode 202. The signals indicative of the degree of impedance match between the output of amplifier 250 and the load coupled to electrode 202 enable microprocessor 20 to derive control signals for the values of variable reactances in matching network 264. The control signals for the values of reactances in matching network 264 are supplied to motors 272 and 270 which control the variable reactances of matching network 264 in a manner similar to the way motors 148 and 150 control the values of capacitors 142 and 146 of matching network 138, FIG. 1.

Microprocessor 20 responds to the output signals of the sensor arrangement 268 and 270 to determine the power (P) and impedance (Z) of the plasma loading electrode 202 in accordance with:

$$P = |V| \cdot |I| \cos\phi;$$ (Equation 1)

and $$Z = \frac{|V|}{|I|} \tan^{-1}\phi,$$ (Equation 2)

where:

|V|=magnitude of sensed voltage,

|I|=magnitude of sensed current, and

ø=the phase angle between the sensed voltage and current.

Microprocessor 20 integrates the power value determined by Equation 1 to determine the energy of the plasma loading electrode 202 in accordance with:

$$\frac{1}{T_2 - T_1} \int_{T_1}^{T_2} P\, dt$$ (Equation 3)

where:

$T_1$ and $T_2$ are the boundaries of each integration period.

Microprocessor 20 responds to the power, impedance and energy values determined in accordance with Equations 1, 2 and 3 to control the gain and hence output power of amplifier 250 and/or the connections provided by switch array 248 between RF sources 242, 244 and 246 and electrode 202.

The output of matching network 264 drives electrode 202 by way of blocking capacitor 271. Capacitor 271 prevents the DC voltage of chucking power supplies 214 and 216, as well as the DC voltages of supplies 230 of thermoelectric controllers 220, 222 and 224 from being coupled to matching network 264.

Networks 256, 258 and 260, in combination with AC source arrangement 240, switch array 248 and amplifiers 250, 252 and 254, can be used for closed loop control as previously discussed or can be used to collect data stored in ROM 30 and hard disk 26 of memory system 24 for subsequent open loop control of the gains of the amplifiers and switch array. When networks 256, 258 and 260 collect data for subsequent open loop control, there is very precise control of the species and flow rates of the gases flowing into chamber 40 through opening 72 and of the vacuum applied to chamber 40. Data are collected for numerous workpieces 54 under these conditions. The data are statistically analyzed to determine appropriate connections for switch array and gains for amplifiers 250, 252 and 254 for subsequent open loop operation under conditions corresponding to those existing when there was very precise control of the species and flow rates of the gases and the vacuum that pump 80 applies to chamber 40.

FIG. 5 is a top view of electrode array 300, a second preferred embodiment of an electrode array in accordance with the present invention. The specific, illustrated embodiment of electrode array 300 is for use in connection with circular workpieces, but it is to be understood that similar principles can be employed with rectangular workpieces.

Array 300 includes two straight stripes 302 and 304 of individual mutually electrically insulated electrodes, such that stripes 302 and 304 respectively include electrodes 311–316 and 321–326 and electrode 328 is common to both stripes. Stripes 302 and 304 are at right angles to each other and intersect at center point 306 of the array, which is aligned with the center of workpiece 54 when the workpiece is correctly positioned on chuck 52. The electrodes of stripes 302 and 304 have a rectangular shape and are aligned with corresponding dies of workpieces 54 so that the electrodes are directly below the dies. The dies of workpiece 54 are the areas of the workpiece that are cut up to form integrated circuit chips.

Array 300 also includes electrodes 331, 332, 333 and 334, each shaped as a sector of a circle having a diameter equal to the diameter of workpiece 54 and a center 336 aligned with the center of the workpiece, when the workpiece is correctly positioned on chuck 52. Each of electrodes 331, 332, 333 and 334 includes a pair of edges at right angles to each other and extending parallel to the edges of stripes 302 and 304, such that, for example, the edges of sector 331 are parallel to the edges of electrodes 311–313 and to the edges of electrodes 321–323. Dielectric strips 338 provide mutual electric insulation between adjacent pairs of electrodes in array 300.

Each of the electrodes of stripes 302 and 304 is connected by way of a network similar to networks 256, 258 and 260 to an AC source arrangement similar to source arrangement 240, to a switch array similar to switch array 248, and to a separate power amplifier similar to power amplifiers 250, 252 and 254. In addition, each of the electrodes of stripes 302 and 304 is preferably associated with a temperature sensor similar to temperature sensors 234 and a thermoelectric temperature controller similar to thermoelectric temperature controllers 220, 222 and 224. Because of the small area of the electrodes of stripes 302 and 304 relative to the electrodes of array 200, array 300 can provide much more accurate control of the plasma energy and density coupled to workpiece 54, and of the workpiece temperature, than is attained by array 200.

Microprocessor 20 responds to the signals that voltage, current and phase angle sensors derive for the electrodes of stripes 302 and 304 to determine appropriate values for the power and frequencies the source arrangement similar to AC source arrangement 240 applies to electrodes 331–334. In addition, thermoelectric controllers similar to controllers 220, 222 and 224 can be employed to control the temperatures of electrodes 331–334.

Electrode array 400, FIG. 6, includes a matrix of rows and columns of mutually electrically insulated electrodes 402. Dielectric strips 404 extend between the edges of adjacent pairs of electrodes 402 to provide the electric insulation between the electrodes. The individual electrodes of array 400 have sizes and shapes corresponding with dies of workpiece 54. When workpiece 54 is properly positioned on chuck 52 so that the centers of the workpiece and array 400 are aligned, the individual electrodes 402 of array 400 are aligned with the dies of the workpiece. Alternatively, electrodes 402 can have sizes corresponding with sub dies of workpiece 54.

Microprocessor 20 responds to the signals that voltage, current and phase angle sensors derive for electrodes 402 to determine appropriate values for the powers and frequencies a source arrangement similar to AC source arrangement 240 applies to electrodes 402. In addition, thermoelectric controllers similar to controllers 220, 222 and 224 can be employed to control the temperatures of electrodes 402.

While there have been described and illustrated specific embodiments of the invention, it will be clear that variations in the details of the embodiments specifically illustrated and described may be made without departing from the true spirit and scope of the invention as defined in the appended claims. For example, because of the symmetrical nature of chamber 40 and the plasma in chamber 40, it can usually be assumed that the plasma coupled to one quadrant of workpiece 54 is similar to the plasma coupled to the remaining quadrants of the workpieces. Consequently, once microprocessor 20 determines the correct information for driving sector 331, FIG. 5, the same information can be used for driving sectors 332, 333 and 334. Because of the detailed information obtained during the processing of the workpieces, particularly with electrode arrays 300 or 400, the necessity to over etch to clear stringers from a slow etch area of the workpieces is obviated; stringer is a term of art frequently used to designate a very narrow line that was not properly etched.

I claim:

1. A vacuum plasma processor for processing a workpiece comprising a vacuum chamber having a gas inlet port, a vacuum port, a workpiece holder, a reactance for exciting gas in the chamber to an AC plasma, and a controller arrangement for controlling temperature properties of different localized portions of a workpiece on the holder, the controller arrangement including a temperature sensor for different localized portions of the workpiece on the holder, the controller including a plurality of thermoelectric devices associated with the different localized portions of the workpiece on the holder, each thermoelectric device including a pair of first and second semiconductor structures, a DC voltage source connected between the first and second semiconductor structures; the electrodes, semiconductor structures and DC voltage source being arranged to cause the first structure to supply heat to the first segment for a first polarity of the voltage and the second structure to remove heat from the second segment for a second polarity of the voltage.

2. A vacuum plasma processor for processing a workpiece comprising a vacuum chamber having a gas inlet port, a vacuum port, a workpiece holder, a reactance for exciting gas in the chamber to plasma, an array of mutually electrically insulated rectangular electrodes for supplying electric fields to the plasma, an AC source arrangement, the electrodes being arranged in a pair of stripes extending at right angles to each other, the stripes intersecting at a region aligned with the center of the workpiece holder, and circuitry for causing differential power to be applied by the AC source arrangement to separate electrodes of the array.

3. The vacuum plasma processor of claim 2 wherein the stripes are included in a matrix of rows and columns.

4. The vacuum plasma processor of claim 3 wherein the workpiece, when processed, includes plural dies, the electrodes being arranged to be aligned with the plural dies of the workpiece when the workpiece is properly positioned on the workpiece holder.

\* \* \* \* \*